(12) United States Patent
Ji et al.

(10) Patent No.: US 11,439,020 B2
(45) Date of Patent: Sep. 6, 2022

(54) ELECTRONIC COMPONENT-EMBEDDED SUBSTRATE

(71) Applicant: SAMSUNG ELECTRO-MECHANICS CO., LTD., Suwon-si (KR)

(72) Inventors: Yun Je Ji, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/213,850

(22) Filed: Mar. 26, 2021

(65) Prior Publication Data

US 2022/0087025 A1 Mar. 17, 2022

(30) Foreign Application Priority Data

Sep. 16, 2020 (KR) .................. 10-2020-0118805

(51) Int. Cl.
*H05K 1/18* (2006.01)
*H01L 23/12* (2006.01)
*H05K 1/11* (2006.01)

(52) U.S. Cl.
CPC ............ *H05K 1/185* (2013.01); *H01L 23/12* (2013.01); *H05K 1/11* (2013.01); *H05K 1/184* (2013.01)

(58) Field of Classification Search
CPC .......... H05K 1/185; H05K 1/11; H05K 1/184; H01L 23/12
USPC ....................................................... 361/761
See application file for complete search history.

(56) References Cited

U.S. PATENT DOCUMENTS

| | | | |
|---|---|---|---|
| 2015/0179561 A1* | 6/2015 | Wu ..................... | H01L 23/3157 174/255 |
| 2016/0233167 A1* | 8/2016 | Shimizu ................ | H01L 21/486 |
| 2017/0256478 A1* | 9/2017 | Sakamoto ............. | H01L 23/522 |
| 2021/0111088 A1* | 4/2021 | Jain ........................ | H01L 23/31 |

FOREIGN PATENT DOCUMENTS

| | | |
|---|---|---|
| JP | 2016-149411 A | 8/2016 |
| KR | 10-2014-0013612 A | 2/2014 |

* cited by examiner

*Primary Examiner* — Binh B Tran
(74) *Attorney, Agent, or Firm* — Morgan, Lewis & Bockius LLP

(57) ABSTRACT

An electronic component-embedded substrate includes a wiring structure including a plurality of insulating layers and a plurality of wiring layers and having a cavity penetrating through at least one of the plurality of insulating layers, a first electronic component disposed in the cavity, a dam structure disposed on the wiring structure and having a through-portion, a first insulating material disposed in at least a portion of each of the cavity and the through-portion, and covering at least a portion of each of the wiring structure and the first electronic component, and a first circuit layer disposed on the first insulating material.

24 Claims, 12 Drawing Sheets

I-I'

II-II'

ELECTRONIC COMPONENT-EMBEDDED SUBSTRATE

CROSS-REFERENCE TO RELATED APPLICATION(S)

This application claims the benefit under 35 USC 119(a) of Korean Patent Application No. 10-2020-0118805 filed on Sep. 16, 2020 in the Korean Intellectual Property Office, the entire disclosure of which is incorporated herein by reference for all purposes.

TECHNICAL FIELD

The present disclosure relates to an electronic component-embedded substrate.

BACKGROUND

As electronic devices in the Information Technology (IT) field, including mobile phones, become lighter and thinner, in response to technical demand, a technology in which electronic components such as IC (Integrated Circuits) are inserted into a printed circuit board is required. Technology is being developed in which electronic components are embedded in a printed circuit board using various methods. Accordingly, various cavity structures are formed in the printed circuit board.

SUMMARY

Exemplary embodiments provide an electronic component-embedded substrate in which a reduced thickness is provided and an electronic component may be embedded in a cavity in a face-up form.

Exemplary embodiments provide an electronic component-embedded substrate in which a microcircuit region may be locally applied onto an electronic component.

For example, an electronic component-embedded substrate is provided using a method of locating a dam structure having a through-portion on a wiring structure having a cavity, locating an electronic component in the cavity, and then filling the cavity and the through-portion with an insulating material having excellent flow properties, and forming a circuit layer on the insulating material.

For example, an electronic component-embedded substrate includes a wiring structure including a plurality of insulating layers and a plurality of wiring layers and having a cavity penetrating through at least one of the plurality of insulating layers, a first electronic component disposed in the cavity, a dam structure disposed on the wiring structure and having a through-portion, a first insulating material disposed in at least a portion of each of the cavity and the through-portion, and covering at least a portion of each of the wiring structure and the first electronic component, and a first circuit layer disposed on the first insulating material.

According to an exemplary embodiment, an electronic component-embedded substrate includes a wiring structure including an insulating layer and a wiring layer disposed on the insulating layer and having a cavity having a bottom surface, an electronic component having one surface on which a connection pad is disposed and the other surface opposite to the one surface, and disposed in such a manner that the other surface faces the bottom surface of the cavity, a dam structure disposed on the wiring structure and having a through-portion having an area larger than an area of the cavity on a plane, and a circuit structure disposed in the through-portion and including an insulating material in which the electronic component is embedded and a circuit layer disposed on the insulating material. At least portions of the wiring layer and the connection pad are connected to each other through at least a portion of the circuit layer.

According to an exemplary embodiment, an electronic component-embedded substrate includes a wiring structure including a plurality of insulating layers and a plurality of wiring layers; a first electronic component attached to the wiring structure; a dam structure disposed on the wiring structure and having a through-portion; an insulating material disposed in the through-portion, and covering at least a portion of each of the wiring structure and the first electronic component; and a circuit layer disposed on the insulating material.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
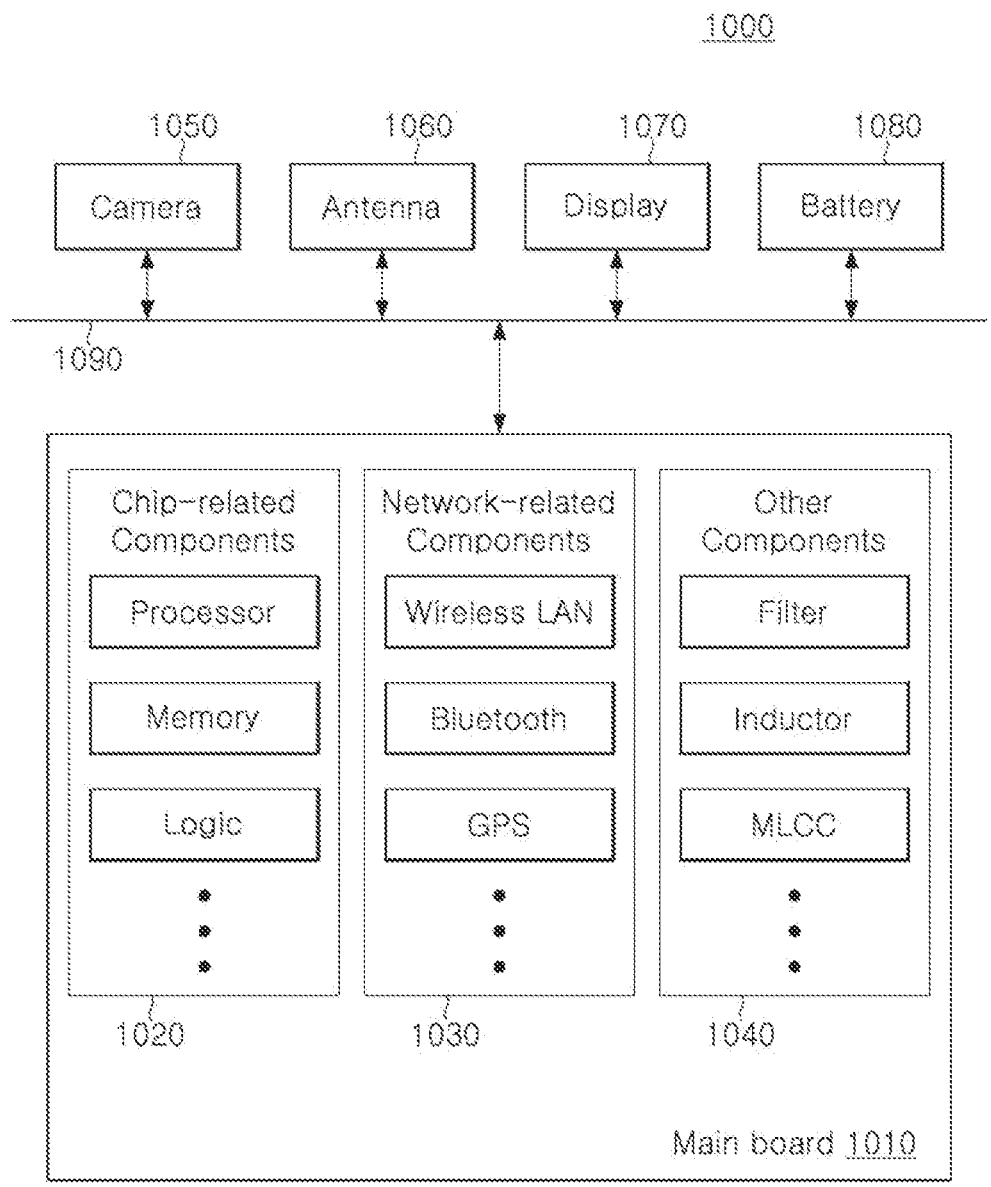
FIG. 1 is a block diagram schematically illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Hereinafter, embodiments will be described with reference to the accompanying drawings. In the drawings, the shapes and sizes of elements may be exaggerated or reduced for clearer explanation.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and in addition to these chip related components, may also include other types of chip related components. In addition, the chip related components 1020 may be combined with each other. The chip-related components 1020 may also be in the form of a package including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with the chip-related components 1020 and provided in a package form.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive devices in the form of chip components used for various other purposes, or the like. In addition, other components 1040 may be combined with the chip-related components 1020 and/or the network-related components 1030 and may be provided in a package form.

Depending on a type of the electronic device 1000, the electronic device 1000 may include other electronic components that may or may not be physically or electrically connected to the mainboard 1010. These other electronic components may include, for example, a camera module 1050, an antenna module 1060, a display device 1070, a battery 1080, or the like. However, these other electronic components are not limited thereto, but may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, the electronic device 1000 may also include other electronic components used for various purposes depending on a type of the electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
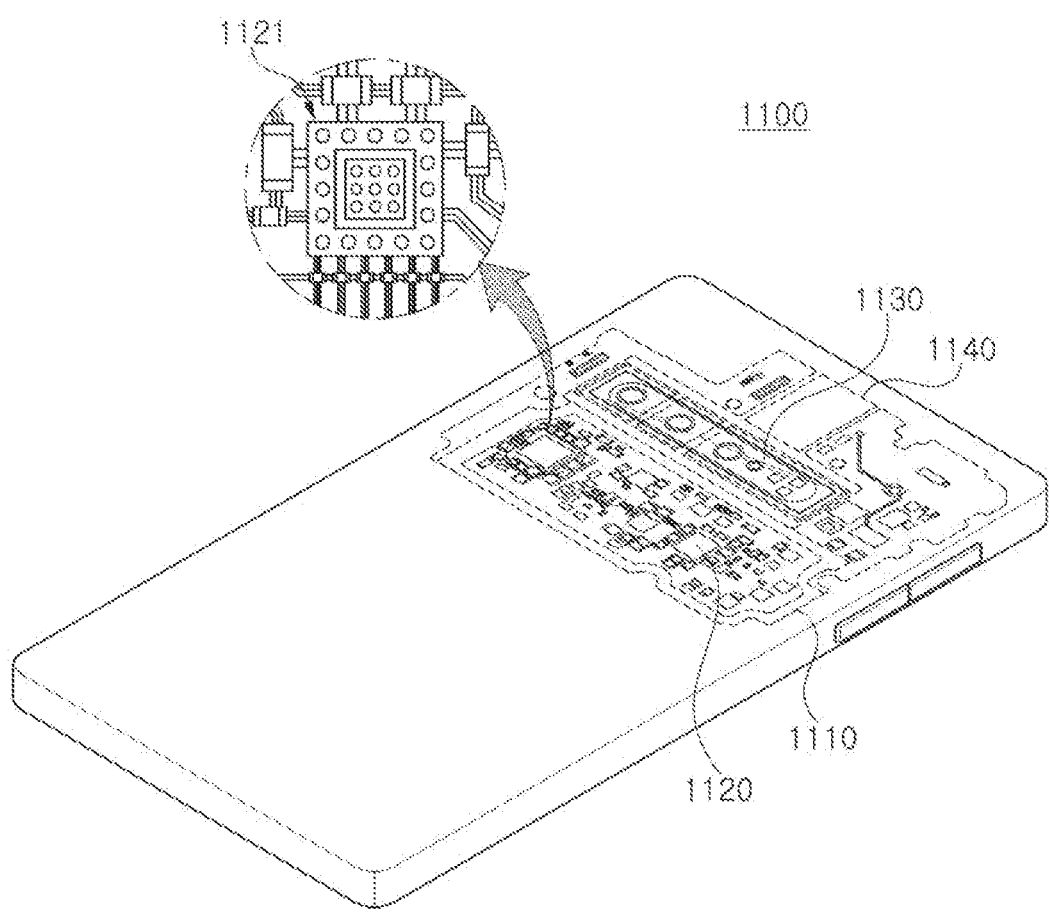
FIG. 2 is a perspective view schematically illustrating an example of an electronic device.

FIG. 2 is a schematic perspective view illustrating an example of an electronic device.

Referring to FIG. 2, an electronic device may be, for example, a smartphone 1100. A motherboard 1110 may be accommodated in the smartphone 1100, and various components 1120 may be physically and/or electrically connected to the motherboard 1110. In addition, a camera module 1130 and/or a speaker 1140, and the like, may be accommodated in the smartphone 1100. Some of the components 1120 may be the chip related components, for example, a semiconductor package 1121, but are not limited thereto. The semiconductor package 1121 may be a package form in which a semiconductor chip is disposed on a multilayer printed circuit board in the form of surface mounting, but is not limited thereto. The electronic device is not necessarily limited to the smartphone 1100, but may be other electronic devices as described above.

Figure 3:
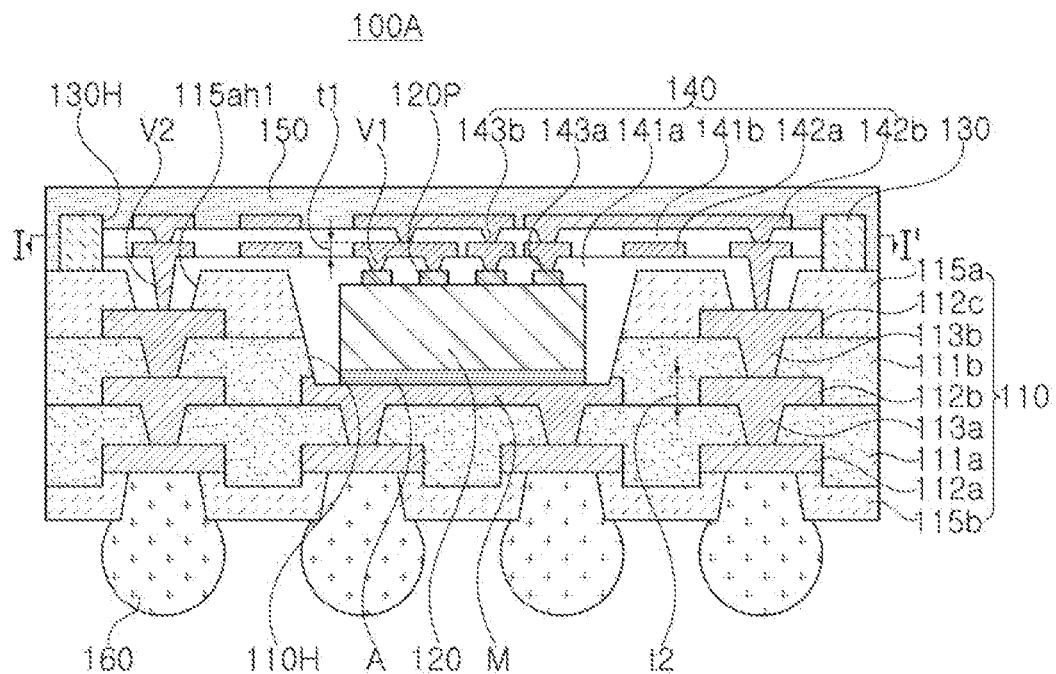
FIG. 3 is a schematic cross-sectional view illustrating an example of an electronic component-embedded substrate.

FIG. 3 is a schematic cross-sectional view illustrating an example of an electronic component-embedded substrate.

Figure 4:
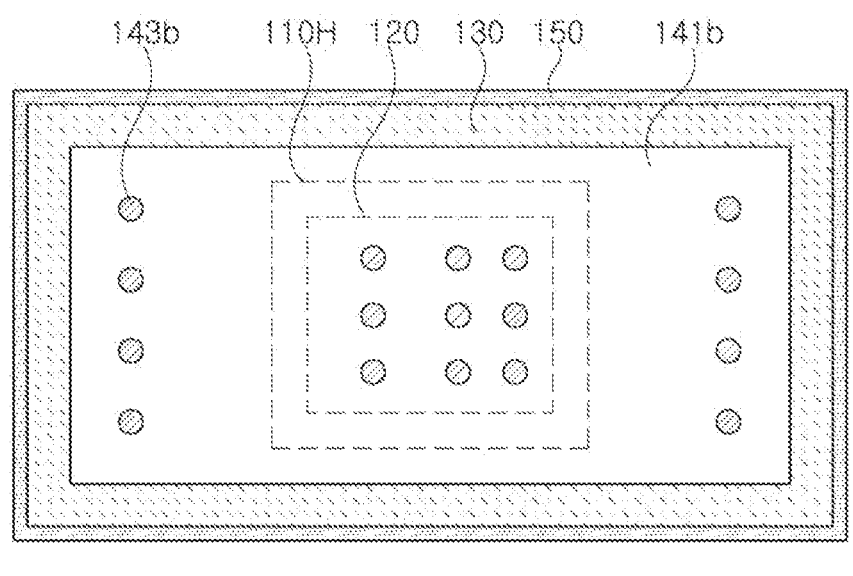
FIG. 4 is a schematic plan view taken along line I-I' of the electronic component-embedded substrate of FIG. 3.

FIG. 4 is a schematic plan view taken along line I-I' of the electronic component-embedded substrate of FIG. 3.

Figure 5:
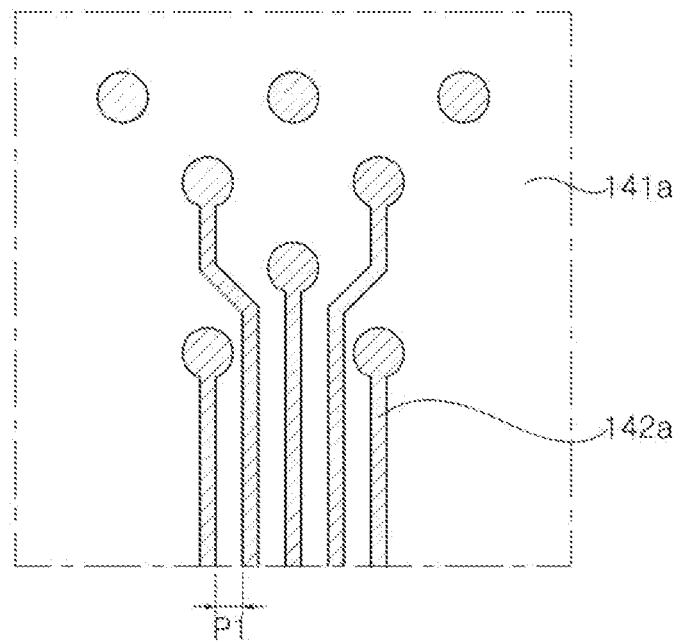
FIG. 5 is a plan view schematically illustrating a region of a first circuit layer of a circuit structure of the electronic component-embedded substrate of FIG. 3.

FIG. 5 is a plan view schematically illustrating a region of a first circuit layer of a circuit structure of the electronic component-embedded substrate of FIG. 3.

Figure 6:
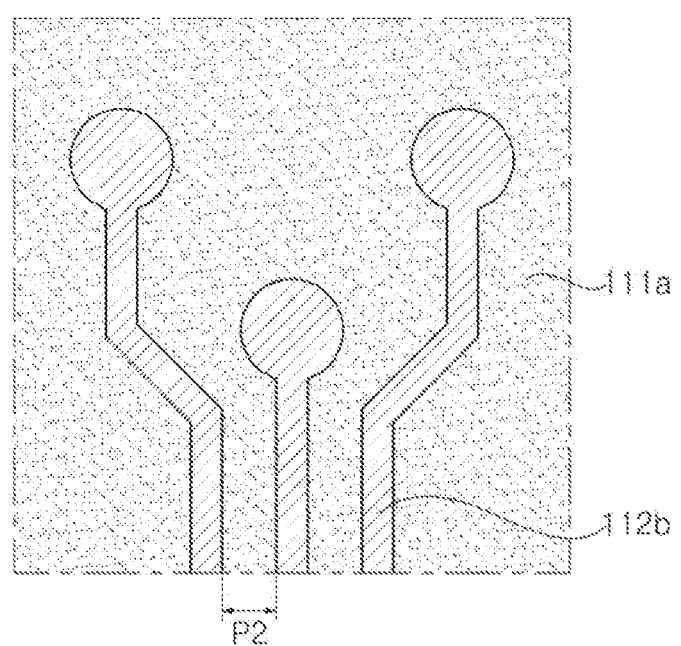
FIG. 6 is a plan view schematically illustrating a region of a second wiring layer of a wiring structure of the electronic component-embedded substrate of FIG. 3.

FIG. 6 is a plan view schematically illustrating a region of a second wiring layer of a wiring structure of the electronic component-embedded substrate of FIG. 3.

Referring to the drawings, an electronic component-embedded substrate 100A according to an example includes a wiring structure 110 having a cavity 110H, an electronic component 120 disposed in the cavity 110H, a dam structure 130 disposed on the wiring structure 110 and having a through-portion 130H, and a circuit structure 140 disposed on the wiring structure 110 and the electronic component 120 in the through-portion 130H. The circuit structure 140 includes a first insulating material 141a filling at least a portion of each of the cavity 110H and the through-portion 130H and covering at least a portion of each of the wiring structure 110 and the electronic component 120, and a first circuit layer 141b disposed on the first insulating material 141a.

On the other hand, as described above, a technology in which electronic components are embedded in a printed circuit board in various manners has been recently developed, and accordingly, various cavity structures are formed in the printed circuit board. For example, a structure in which a cavity is formed in a printed circuit board, a bump pad is formed in an inner region of the cavity, and a die is mounted in a face-down form is provided as an example. In this case, a barrier may be required to prevent damage to the bump pad in the process of forming the cavity. In addition, since the number of wirings under the die increases, the number of layers of the substrate may increase, and it may be difficult to reduce the thickness. In addition, when multi-die is mounted, a path for interconnection between dies may be lengthened, and circuit closeness may be complicated. In addition, there may be some difficulties in coping with microcircuits. In addition, since the back surface of the die is simply covered with a molding material, the heat dissipation efficiency may be relatively low.

Meanwhile, in the case of the electronic component-embedded substrate 100A according to an example, after disposing the electronic component 120 in the cavity 110H of the wiring structure 110, the cavity 110H and the through-portion 130H are filled with a first insulating material 141a having excellent flowability, using the dam structure 130 having the through-portion 130H, and a first circuit layer 142a is formed on the first insulating material 141a. Accordingly, bump pads are unnecessary in the inner region of the cavity 110H, and in the case in which the electronic component 120 is a die, the electronic component may be mounted in a face-up form. In addition, since the number of wiring layers may be reduced as a whole, it is also advantageous for thinning. In addition, in the case of mounting a multi-die, since interconnection is possible through the circuit structure 140, the path may be reduced and the circuit closeness may be simplified. In addition, the circuit structure 140 may be manufactured by performing a plating process on an insulating material having excellent flow properties that may be used in a process that is easy to form microcircuits, for example, Photo Imageable Dielectric (PID) that may use a photolithography process, or Ajinomoto Build-up Film (ABF) or the like, including an inorganic filler and an insulating resin without glass fiber, which may use Semi Additive Process (SAP), and thus, is easy for implementing a microcircuit. As a result, a microcircuit may be easily, locally implemented on the electronic component 120.

On the other hand, the dam structure 130 may be disposed to surround the cavity 110H on a plane. The through-portion 130H may expose the cavity 110H. For example, the through-portion 130H may have an area larger than that of the cavity 110H on a plane. The dam structure 130 may be continuously disposed, thereby stably forming the circuit structure 140. The dam structure 130 may have a quadrangular ring shape on a plane, but the shape thereof is not limited thereto, and may have a ring shape of another shape. In one example, the plane may refer to a plane parallel to an upper surface of the wiring structure 110. The dam structure 130 may include solder resist as a photoimageable dielectric material, and in this case, the through-portion 130H may be more easily formed through a photolithography process.

On the other hand, the wiring structure 110 may include a plurality of insulating layers 111a and 111b and a plurality of wiring layers 112a, 112b and 112c. The cavity 110H may penetrate through at least one of the plurality of insulating layers 111a and 111b. A stopper layer, for example, a metal layer M may be disposed on the bottom surface of the cavity 110H, and thus, the cavity 110H may be easily processed, and the electronic component 120 may be easily disposed on the metal layer M in a face-up form using an adhesive member A or the like. In addition, heat may be easily radiated to the lower side of the electronic component 120 through the metal layer M. The metal layer M may be formed together with any one of the plurality of wiring layers 112a, 112b and 112c through a plating process and may be positioned on the same level. For example, the metal layer M may be formed together with the second wiring layer 112b by a plating process, to be positioned on the same level. For example, the stopper layer may be formed without an additional process.

At least a portion of at least one of the plurality of wiring layers 112a, 112b and 112c of the wiring structure 110, for example, at least a portion of the third wiring layer 112c, may be electrically connected to at least one of a plurality of connection pads 120P disposed on the top surface of the electronic component 120 through at least a portion of the first circuit layer 142a. For example, at least one of the plurality of connection pads 120P of the electronic component 120 and at least a portion of the third wiring layer 112c are respectively electrically connected to at least a portion of the first circuit layer 142a through a first connection via V1 and a second connection via V2 penetrating through at least a portion of the first insulating material 141a, and thus, may be electrically connected to each other through the first circuit layer 142a.

On the other hand, the wiring structure 110 may further include a first passivation layer 115a disposed on a second insulating layer 111b disposed on an uppermost side among the plurality of insulating layers 111a and 111b, and a second passivation layer 115b disposed on a first insulating layer 111a disposed on the lowermost side among the plurality of insulating layers 111a and 111b. The first passivation layer 115a may have an opening 115ah1 exposing at least a portion of a third wiring layer 112c disposed on the uppermost side among the plurality of wiring layers 112a, 112b and 112c. The opening 115ah1 may be located in the through-portion 130H on a plane. Accordingly, the first insulating material 141a may fill at least a portion of the opening 115ah1. The second connection via V2 may penetrate through the first insulating material 141a in the opening 115ah1 to be electrically connected to at least a portion of the third wiring layer 112c.

On the other hand, the first circuit layer 142a of the circuit structure 140 may be thinner than at least one of the plurality of wiring layers 112a, 112b and 112c of the wiring structure 110 and may have a relatively lower pitch between patterns. For example, when the thickness of the first circuit layer 142a is t1 and the thickness of the second wiring layer 112b is t2, t1<t2 may be satisfied. Further, when the pitch between patterns of the first circuit layer 142a is P1 and the pitch between patterns of the second wiring layer 112b is P2, P1<P2 may be satisfied. For example, a high-density microcircuit having a relatively finer pitch may be provided.

On the other hand, the circuit structure 140 may be configured in multiple layers. For example, the circuit structure 140 may further include a second insulating material 141b disposed on the first insulating material 141a within the through-portion 130H and covering at least a portion of the first circuit layer 142a, and a second circuit layer 142b disposed on the second insulating material 141b. Similarly to the first insulating material 141a, the second insulating material 141b may include an insulating material having good flowability such as PID or ABF. Similarly to the first circuit layer 142a, the second circuit layer 142b may be thinner than at least one of the plurality of wiring layers 112a, 112b and 112c of the wiring structure 110, and may have a relatively finer pitch between patterns thereof. For example, a high-density microcircuit having a relatively finer pitch may be provided.

If necessary, the electronic component-embedded substrate 100A according to an example may further include a cover layer 150 disposed on the circuit structure 140 to cover at least a portion of each of the wiring structure 110, the dam structure 130, and the circuit structure 140. In addition, the electronic component-embedded substrate 100A may further include an electrical connection metal 160 disposed under the wiring structure 110 and electrically connected to a lowermost first wiring layer 112a among the plurality of wiring layers 112a, 112b and 112c.

Hereinafter, each configuration included in the electronic component-embedded substrate 100A according to an example will be described in more detail with reference to the drawings.

The wiring structure 110 includes the plurality of insulating layers 111a and 111b and the plurality of wiring layers 112a, 112b and 112c, and has the cavity 110H penetrating through at least one of the plurality of insulating layers 111a, 111b. The wiring structure 110 may further include a plurality of wiring via layers 113a and 113b and/or the plurality of passivation layers 115a and 115b. For example, the wiring structure 110 may include the first insulating layer 111a, the first wiring layer 112a embedded in a lower side of the first insulating layer 111a and having a lower surface exposed to the lower surface of the first insulating layer 111a, the second wiring layer 112b disposed on the upper surface of the first insulating layer 111a, the first wiring via layer 113a penetrating through the first insulating layer 111a and connecting the first and second wiring layers 112a and 112b, the second insulating layer 111b disposed on the upper surface of the first insulating layer 111a and covering at least a portion of the second wiring layer 112b, the third wiring layer 112c disposed on the second insulating layer 111b, the second wiring via layer 113b penetrating through the second insulating layer 111b and connecting the second and third wiring layers 112b and 112c, the first passivation layer 115a disposed above the third insulating layer 111a, and the second passivation layer 115b disposed below the first insulating layer 111a, and may have the cavity 110H penetrating through the second insulating layer 111b and the first passivation layer 115a.

An insulating material may be used as a material of the plurality of insulating layers 111a and 111b, and as the insulating material, a thermosetting resin such as epoxy resin or a thermoplastic resin such as polyimide, and a material in which these resins are mixed with an inorganic filler such as silica and/or a reinforcing material such as glass fiber may be used. For example, Prepreg (PPG) may be used as a material for each of the plurality of insulating layers 111a and 111b. The plurality of insulating layers 111a and 111b may be built up in a coreless form. For example, the plurality of insulating layers 111a and 111b may have substantially the same thickness, but the configuration is not limited thereto.

A metal material may be used as a material for the plurality of wiring layers 112a, 112b and 112c, and as the metal material, copper (Cu), aluminum (Al), silver (Ag), tin (Sn), gold (Au), nickel (Ni), lead (Pb), titanium (Ti), or alloys thereof may be used. Each of the plurality of wiring layers 112a, 112b and 112c may perform various functions according to a design. For example, the plurality of wiring layers 112a, 112b and 112c may include a ground pattern, a power pattern, a signal pattern, and the like. In this case, the signal pattern includes various signals, for example, data signals, excluding the ground pattern and the power pattern. Each of these patterns may have a line, a plane, or a pad shape. The plurality of wiring layers 112a, 112b and 112c may be formed by a plating process such as Modified SAP (MSAP), Tenting (TT), or the like, and as a result, may include a seed layer, which is an electroless plating layer, and an electrolytic plating layer formed on the basis of the seed layer. A specific layer may further include copper foil.

On the other hand, the lower surface of the first wiring layer 112a may have a step difference from the lower surface of the first insulating layer 111a. For example, the lower surface of the first wiring layer 112A may be positioned on a higher level than the lower surface of the first insulating layer 111a. In addition, the upper surface of the metal layer M may have a step. For example, the thickness of the metal layer M in a region exposed to the cavity 110H may be thinner than a thickness thereof in a region covered with the second insulating layer 111b. These characteristics of the step may be provided by characteristics of a process of forming the wiring structure 110 and the cavity 110H.

A metal material may be used as a material for the plurality of wiring via layers 113a and 113b, and as the metal material, copper (Cu), aluminum (Al), silver (Ag), tin (Sn), gold (Au), nickel (Ni), lead (Pb), titanium (Ti), or alloys thereof may be used. Each of the plurality of wiring via layers 113a and 113b may include a signal connection via, a ground connection via, a power connection via, and the like according to a design. Each of wiring vias of the plurality of wiring via layers 113a and 113b may be completely filled with a metal material, or may be formed as a metal material is formed along a wall surface of the via hole. In addition, the wiring vias may have shapes tapered in the same direction. The plurality of wiring via layers 113a and 113b may be formed by a plating process, for example, MSAP or TT, and as a result, may include a seed layer, which is an electroless plating layer, and an electrolytic plating layer formed based on the seed layer.

The plurality of passivation layers 115a and 115b may protect the internal configurations of the wiring structure 110 from external physical and chemical damage. The plurality of passivation layers 115a and 115b may cover at least a portion of the third wiring layer 112c and at least a portion of the first wiring layer 112a, respectively, and respectively may have an opening exposing at least a portion of the third wiring layer 112c and at least a portion of the first wiring layer 112a. An insulating material may be used as the material of the plurality of passivation layers 115a and 115b. In this case, the insulating material may be a thermosetting resin such as epoxy resin, a thermoplastic resin such as polyimide, or a material in which these resins are mixed with an inorganic filler, for example, ABF, may be used, but the present disclosure is not limited thereto. For example, SR including a photoimageable dielectric material may be used.

The electronic component 120 is disposed in the cavity 110H. The electronic component 120 may be an IC in which hundreds to millions of devices are integrated into in a single chip. For example, the electronic component 120 may be a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, may be an application processor (AP), but is not limited thereto. In addition, the electronic component 120 may be a memory such as other volatile memories (for example, a dynamic random access memory (DRAM)), a non-volatile memory (for example, a read only memory (ROM)), a flash memory, or the like; or logic such as an analog-to-digital (ADC) converter, an application-specific integrated circuit (ASIC), or the like. The electronic component 120 may be a chip-shaped passive component, for example, a chip-shaped inductor or a chip-type capacitor. Alternatively, the electronic component 120 may be a combination of an IC and a chip-shaped passive component, and in this case, the cavity 110H may be provided as a plurality of cavities.

The electronic component 120 may be disposed in a face-up shape such that the surface on which the connection pad 120P is disposed faces the circuit structure 140. The electronic component 120 may be attached to the bottom surface of the cavity 110H through an adhesive member A such as a die attach film (DAF) or the like. The connection pad 120P may include a metal material such as copper (Cu) or aluminum (Al). The connection pad 120P may be disposed to protrude from the insulating body of the electronic component 120, or alternatively, may be disposed to be embedded in the insulating body of the electronic component 120. Metal bumps such as copper bumps may be further disposed on the connection pads 120P, respectively.

The dam structure 130 may be disposed to surround the cavity 110H on a plane. The through-portion 130H may expose the cavity 110H. For example, the through-portion 130H may have an area larger than that of the cavity 110H on a plane. The dam structure 130 may be continuously disposed, and thus, may thus allow the circuit structure 140 to be formed stably. The dam structure 130 may have a quadrangular ring shape on a plane, but the shape thereof is not limited thereto, and may have a ring shape of another shape. The dam structure 130 may include SR, which is a photoimageable dielectric material, but the material thereof is not limited thereto.

The circuit structure 140 includes one or more insulating materials 141a and 141b and one or more circuit layers 142a and 142b, and may further include one or more connection via layers 143a and 143b. For example, the circuit structure 140 may include a first insulating material 141a, a first circuit layer 142a disposed on the first insulating material 141a, a first connection via layer 143a penetrating through the first insulating material 141a and connecting the first circuit layer 142a to the connection pad 120P and the third wiring layer 112c, a second insulating material 141b disposed on the first insulating material 141a and covering at least a portion of the first circuit layer 142a, a second circuit layer 142b disposed on the second insulating material 141b, and a second connection via layer 143b penetrating through the second insulating material 141b and connecting the first and second circuit layers 142a and 142b.

An insulating material may be used as a material of insulating materials 141a and 141b provided as one or more layers, and as the insulating material, an insulating material having good flowability, for example, PID as a photoimageable dielectric material or ABF including an inorganic filler and an insulating resin without glass fiber or the like may be used.

A metal material may be used as a material for one or more circuit layers 142a and 142b, and as the metal material, copper (Cu), aluminum (Al), silver (Ag), tin (Sn), gold (Au), nickel (Ni), lead (Pb), titanium (Ti), or alloys thereof may be used. Each of the one or more circuit layers 142a and 142b may perform various functions according to a design. For example, the circuit layers 142a and 142b may include a ground pattern, a power pattern, a signal pattern, and the like. In this case, the signal pattern includes various signals, such as data signals, excluding the ground pattern and the power pattern. Each of these patterns may have a line, plane, or pad shape. One or more circuit layers 142a and 142b may be formed by a plating process such as AP or SAP, and as a result, each may include a seed layer, which is an electroless plating layer, and an electrolytic plating layer formed based on the seed layer.

A metal material may be used as a material for one or more connection via layers 143a and 143b, and as the metal material, copper (Cu), aluminum (Al), silver (Ag), tin (Sn), gold (Au), nickel (Ni), lead (Pb), titanium (Ti), or alloys thereof may be used. Each of the one or more connection via layers 143a and 143b may include a signal connection via, a ground connection via, a power connection via, and the like according to a design. Each of wiring vias of the one or more connection via layers 143a and 143b may be completely filled with a metal material, or may be formed as the metal material is formed along a wall surface of the via hole. In addition, the wiring vias of the one or more connection via layers 143a and 143b may have tapered shapes tapered in the same direction. One or more connection via layers 143a and 143b may be formed by a plating process, for example, AP, SAP, or the like, and as a result, may include a seed layer, which is an electroless plating layer, and an electrolytic plating layer formed based on the seed layer.

The cover layer 150 may protect the circuit structure 140 and the like from external physical and chemical damage. The material of the cover layer 150 may be an insulating material. In this case, a thermosetting resin such as an epoxy resin, a thermoplastic resin such as polyimide, or a material in which these resins are mixed with an inorganic filler, for example, ABF, may be used as the insulating material, but is not limited thereto. For example, other known Epoxy Molding Compound EMC (EMC) or the like may be used.

The electrical connection metal 160 may physically and/or electrically connect the electronic component-embedded substrate 100A to external components, and thus, for example, the electronic component-embedded substrate 100A may be mounted on a main board of an electronic device or other BGA substrates. The electrical connection metal 160 may be formed of tin (Sn) or an alloy containing tin (Sn), such as solder, which is only an example, and the material is not particularly limited thereto. The electrical connection metal 160 may respectively be a land, a ball, or a pin.

Figure 7:
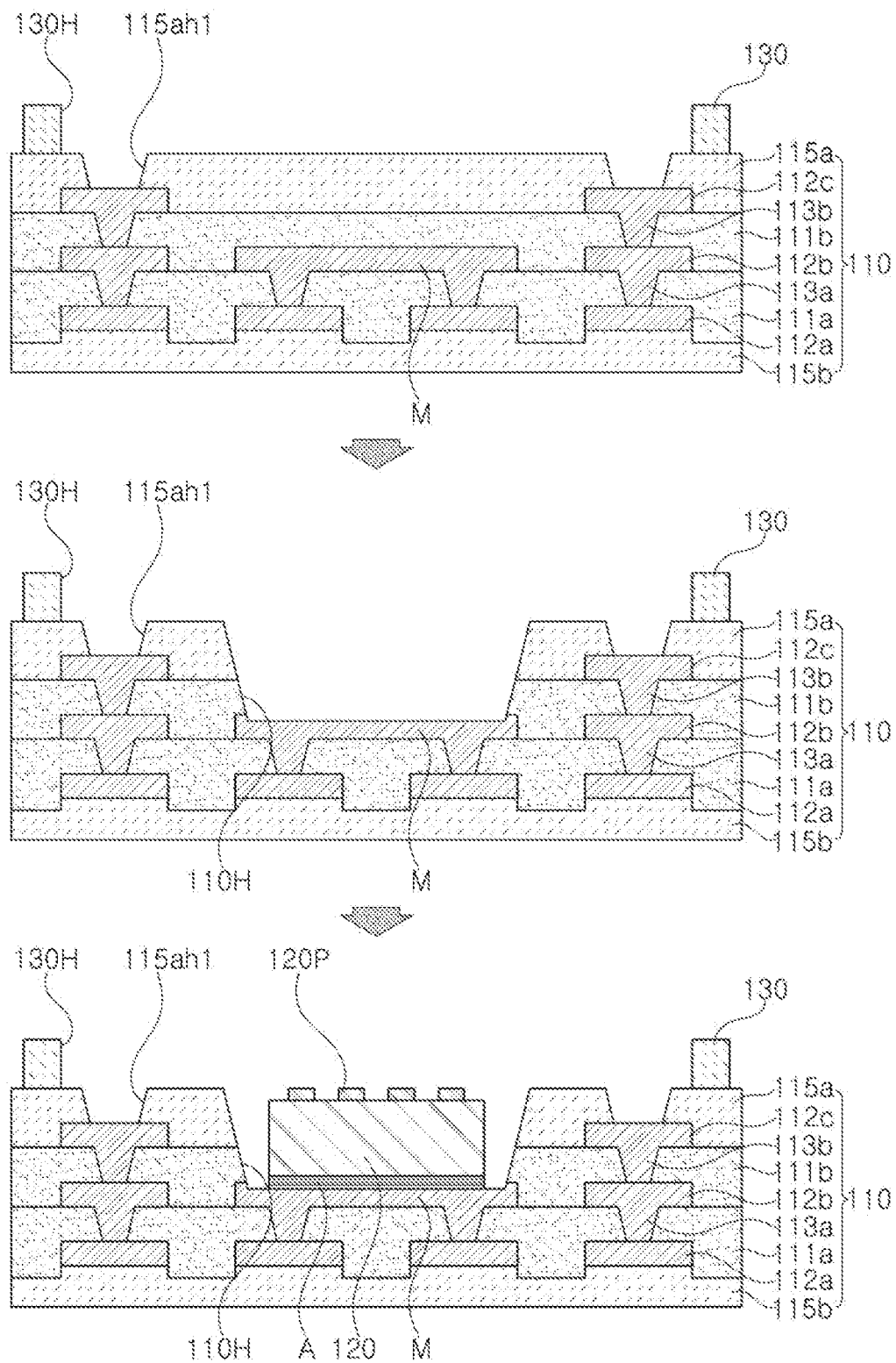
FIGS. 7 and 8 are process diagrams schematically illustrating an example of manufacturing the electronic component-embedded substrate of FIG. 3.
Figure 8:
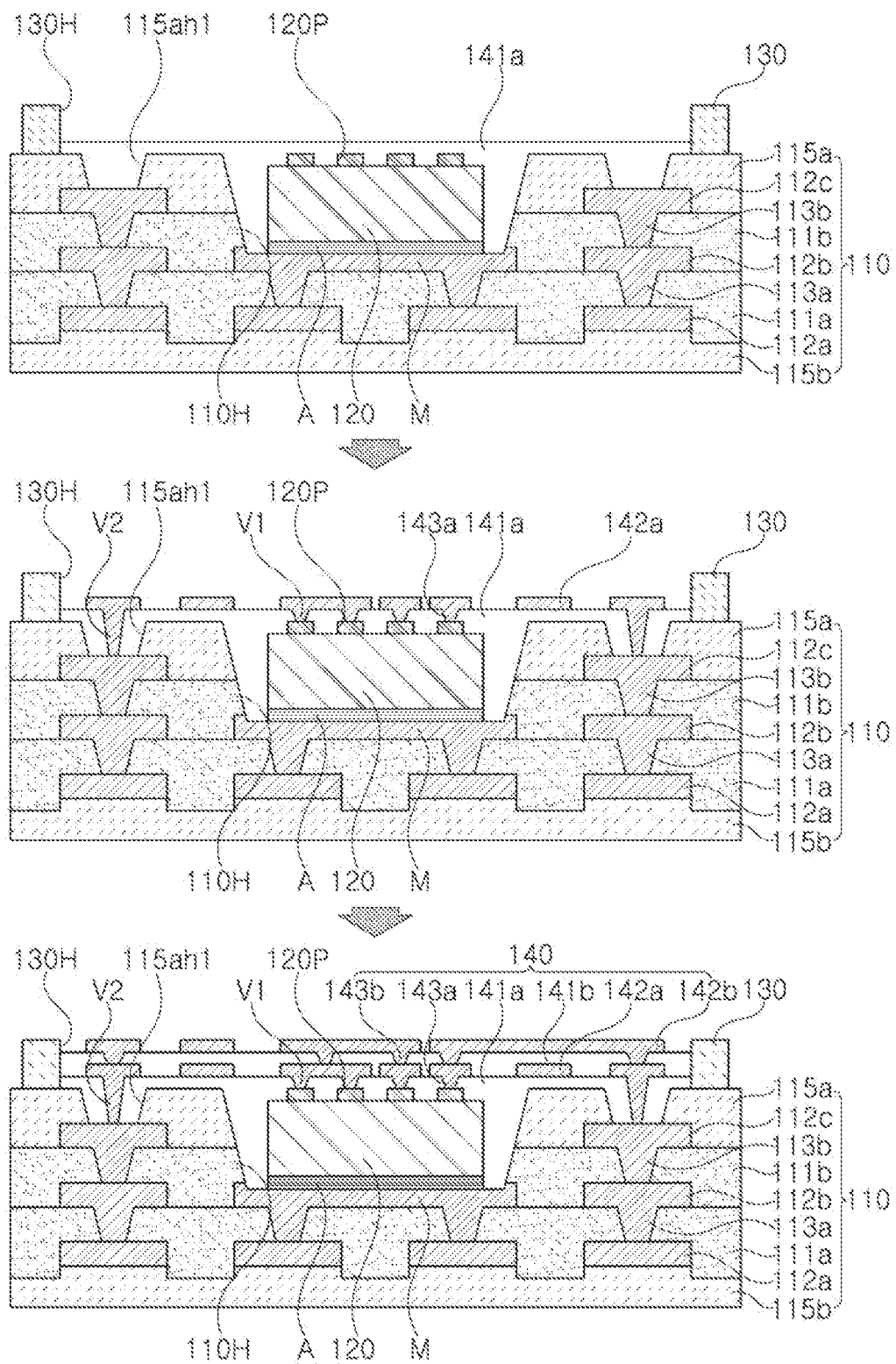

FIGS. 7 and 8 are process diagrams schematically illustrating an example of manufacturing the electronic component-embedded substrate of FIG. 3.

Referring to FIG. 7, first, a wiring structure 110 is prepared by a coreless process using a detach carrier. Thereafter, a dam structure 130 having a through-portion 130H is formed on a first passivation layer 115a of the wiring structure 110 by using a solder resist material and a photolithography process. Next, a cavity 110H is formed in the wiring structure 110 by blasting processing or laser processing. Next, an electronic component 120 is attached to the bottom surface of the cavity 110H in a face-up form using an adhesive member A or the like.

Referring to FIG. 8, next, an insulating material having excellent flowability is introduced into the dam structure 130 to form a first insulating material 141a. For example, a photoimageable dielectric material such as PID, or an insulating material such as ABF without glass fiber may be applied. Next, via holes are formed in the first insulating material 141a by photolithography or laser processing, and the first circuit layer 141a and the first connection via layer 143a are formed by a plating process. Next, an insulating material having excellent flowability is reintroduced to the dam structure 130 to form a second insulating material 141b. In addition, similarly, via holes are formed in the second insulating material 141b, and the second circuit layer 142b and the second connection via layer 143b are formed by a plating process. Through a series of processes, a circuit structure 140 may be formed. Thereafter, when a cover layer 150 or an electrical connection metal 160 is formed as necessary, an electronic component-embedded substrate 100A according to the example described above may be provided.

Other details are substantially the same as described above, and thus, may be omitted.

Figure 9:
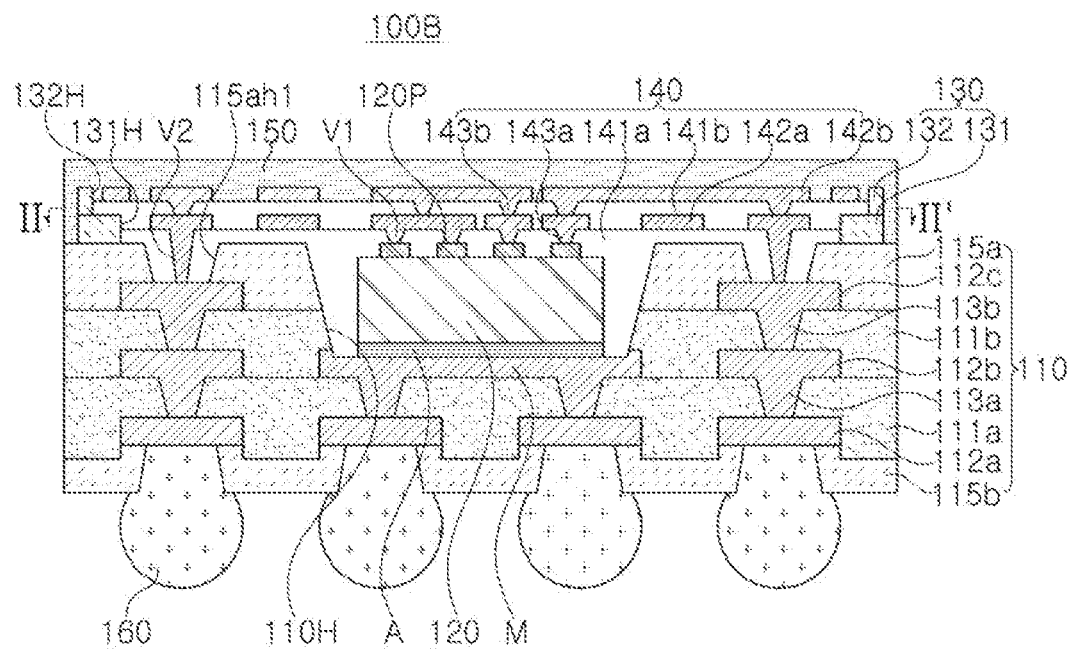
FIG. 9 is a schematic cross-sectional view illustrating another example of an electronic component-embedded substrate.

FIG. 9 is a schematic cross-sectional view illustrating another example of an electronic component-embedded substrate.

Figure 10:
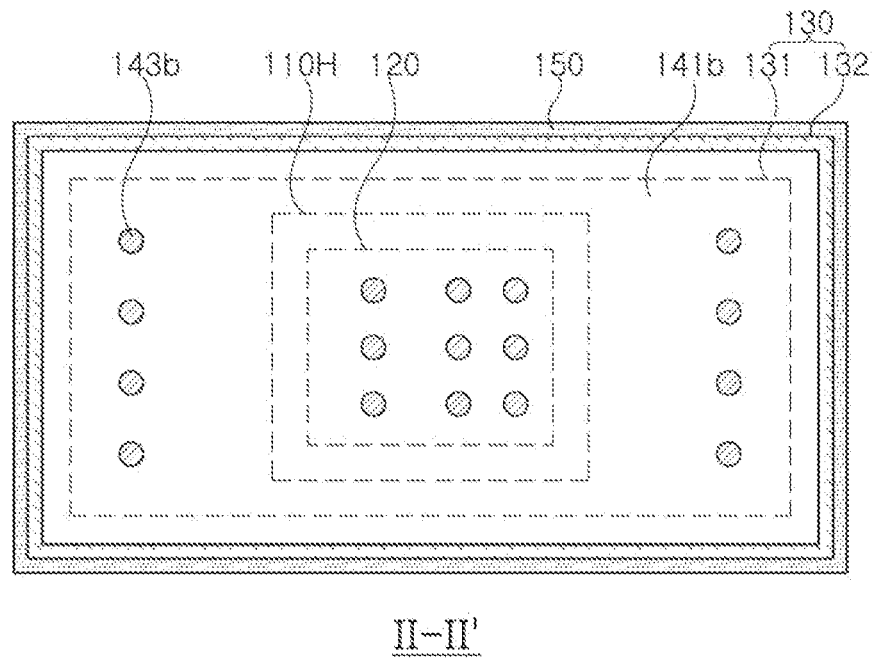
FIG. 10 is a schematic cross-sectional plan view taken along line II-II' of the electronic component-embedded substrate of FIG. 9.

FIG. 10 is a schematic plan view of a cross section of the electronic component-embedded substrate taken along line II-II' of FIG. 9.

Referring to the drawings, in the case of an electronic component-embedded substrate 100B according to another example, the dam structure 130 includes a plurality of dam portions 131 and 132 which have through-portions 131H and 132H, respectively, in the electronic component-embedded substrate 100A described above. For example, the dam structure 130 may include a first dam portion 131 having a first through-portion 131H, and a second dam portion 132 disposed on the first dam portion 131 and having a second through-portion 132H connected to the first through-portion 131H. Inner walls of the first and second through-portions 131H and 132H may have a step difference, and in this case, the circuit structure 140 may be formed to have a relatively larger area. If necessary, the circuit structure 140 may be configured in relatively further multiple layers accordingly.

Other details are substantially the same as described above and thus, may be omitted.

Figure 11:
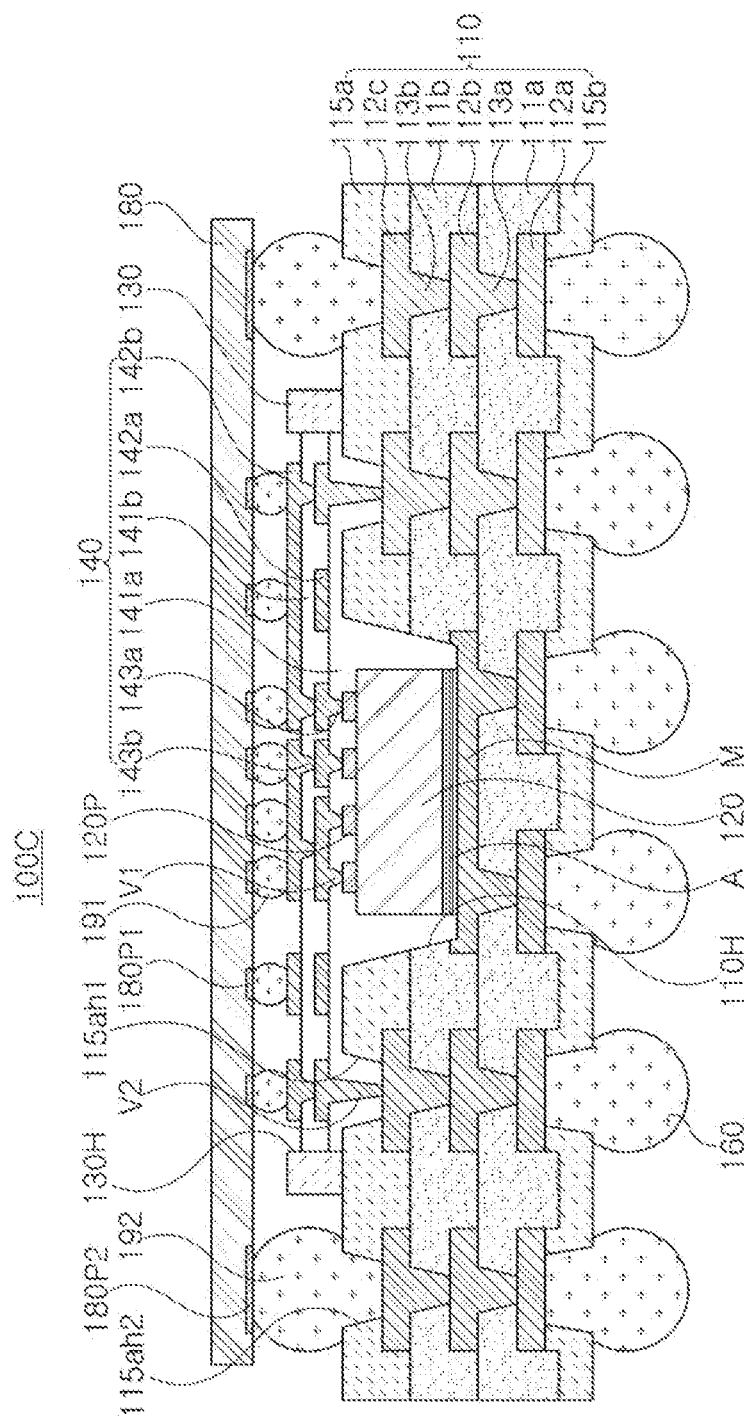
FIG. 11 is a schematic cross-sectional view illustrating another example of an electronic component-embedded substrate.

FIG. 11 is a schematic cross-sectional view illustrating another example of an electronic component-embedded substrate.

Figure 12:
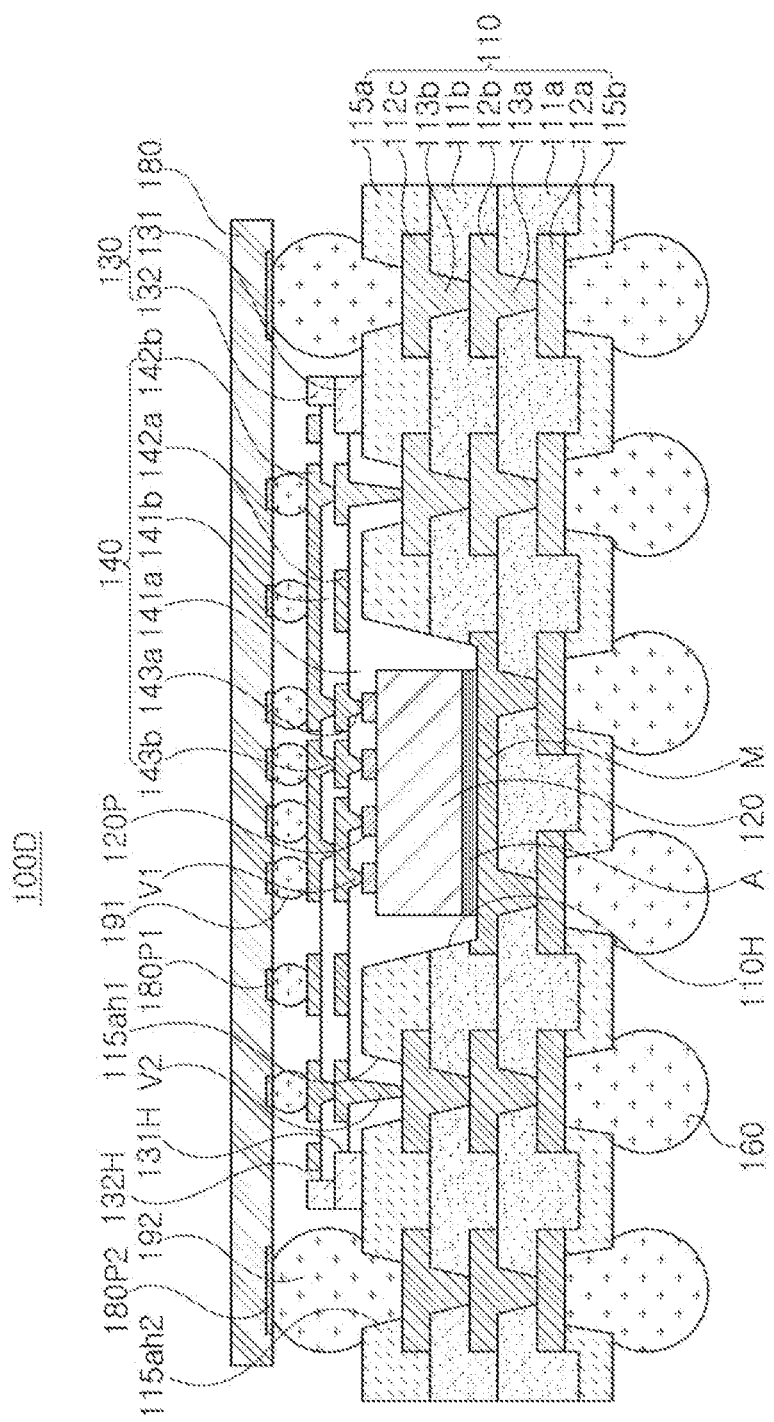
FIG. 12 is a schematic cross-sectional view of another example of an electronic component-embedded substrate.

FIG. 12 is a schematic cross-sectional view of another example of an electronic component-embedded substrate.

Referring to the drawings, electronic component-embedded substrates 100C and 100D according to other examples further include a second electronic component 180 which is disposed on a first passivation layer 115a and at least partially overlaps the first electronic component 120 on a plane, in the above-described electronic component-embedded substrates 100A and 100B. In this case, the circuit structure 140 is disposed between the first and second electronic components 120 and 180, and may serve as an interconnection therebetween. For example, the second electronic component 180 may be disposed in a face-down shape such that a plurality of second connection pads 180P1 and 180P2 face the circuit structure 140, and at least one 180P1 of the plurality of second connection pads 180P1 and 180P2 may be electrically connected to at least one of a plurality of first connection pads 120P of the first electronic component 120 through a first connection member 191 and the circuit structure 140. In addition, the first passivation layer 115a may include not only a first opening 115ah1 exposing at least a portion of an uppermost third wiring layer 112c of the wiring structure 140, but also a second opening 115ah2 that exposes another at least part. In this case, the other at least one 180P2 of the plurality of second connection pads 180P1 and 180P2 of the second electronic component 180 is electrically connected to the other at least part of the third wiring layer 112c exposed through the second opening 115ah2 of the first passivation layer 115a. The second opening 115ah2 may be located outside of the through-portion 130H of the dam structure 130.

The second electronic component 180 may be an IC in which hundreds to millions of devices are integrated into a single chip. For example, the second electronic component 180 may be a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, may be an application processor (AP), but is not limited thereto. In addition, the second electronic component 180 may be a memory such as other volatile memories (for example, a dynamic random access memory (DRAM)), a non-volatile memory (for example, a read only memory (ROM)), a flash memory, or the like; or logic such as an analog-to-digital (ADC) converter, an application-specific integrated circuit (ASIC), or the like. The second electronic component 180 may be a chip-shaped passive component, for example, a chip-shaped inductor or a chip-type capacitor. Alternatively, the second electronic component 180 may be a combination of an IC and a chip-shaped passive component.

The second electronic component 180 may be disposed in a face-down shape such that a surface on which the second connection pads 180P1 and 180P2 are disposed faces the circuit structure 140. The second electronic component 180 may be surface mounted on the wiring structure 110 and the circuit structure 140 through first and second connection members 191 and 192. The second connection pads 180P1 and 180P2 may include a metal material such as copper (Cu), aluminum (Al) or the like. The second connection pads 180P1 and 180P2 may be disposed to protrude from an insulating body of the second electronic component 180, or alternatively, may be disposed to be embedded in the insulating body of the second electronic component 180. The second connection pads 180P1 and 180P2 are provided with metal bumps such as copper bumps further disposed thereon, to be connected to the first and second connection members 191 and 192, respectively. The first and second connection members 191 and 192 may be formed of tin (Sn) or an alloy containing tin (Sn), for example, solder, or the like, which is only an example and the material is not specifically limited thereto. Each of the first and second connection members 191 and 192 may be a ball or the like.

Other details are substantially the same as described above and may thus be omitted.

Figure 13:
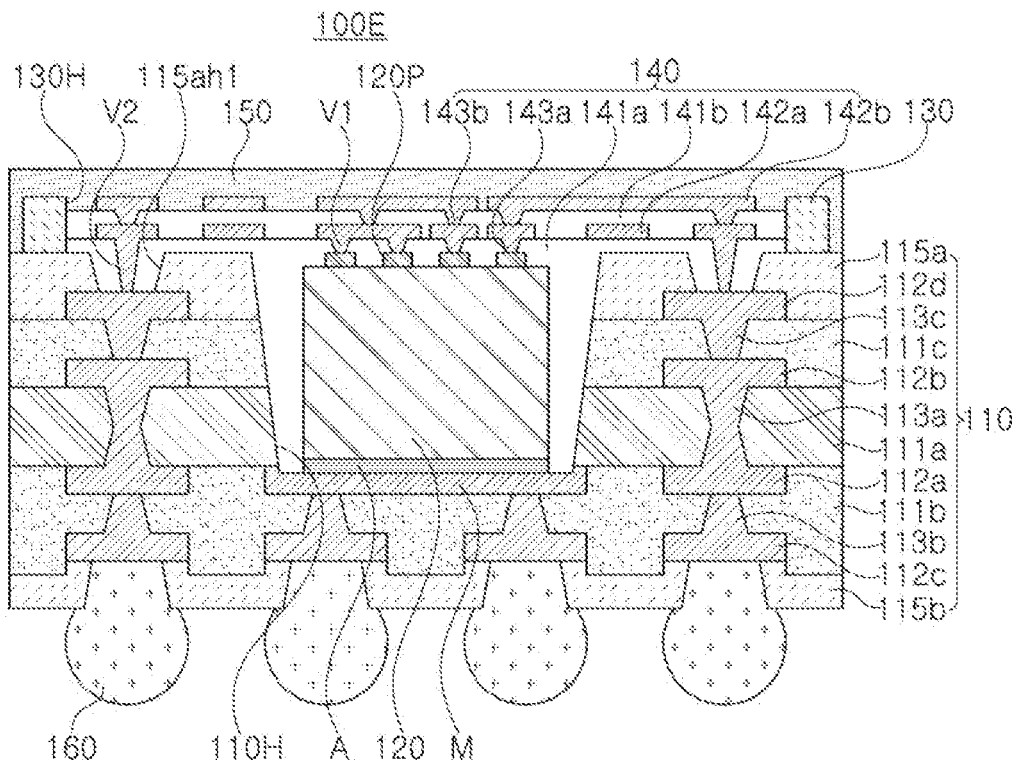
FIG. 13 is a schematic cross-sectional view of another example of an electronic component-embedded substrate.

FIG. 13 is a schematic cross-sectional view of another example of an electronic component-embedded substrate.

Referring to the drawings, in the case of an electronic component-embedded substrate 100E according to another example, the wiring structure 110 has a cored substrate shape, in the above-described electronic component-embedded substrate 100A. For example, the wiring structure 110 may include a first insulating layer 111a, a first wiring layer 112a disposed on the lower surface of the first insulating layer 111a, a second wiring layer 112b disposed on the upper surface of the first insulating layer 111a, a first wiring via layer 113a penetrating through the first insulating layer 111a and connecting the first and second wiring layers 112a and 112b, a second insulating layer 111b disposed on the lower surface of the first insulating layer 111a to cover at least a portion of the first wiring layer 112a, a third wiring layer 112c disposed on the lower surface of the second insulating layer 111b, a second wiring via layer 113b penetrating through the second insulating layer 111b and connecting the first and third wiring layers 112a and 112c, a third insulating layer 111c disposed on the upper surface of the first insulating layer 111a and covering at least a portion of the second wiring layer 112b, a fourth wiring layer 112d disposed on the upper surface of the third insulating layer 111c, a third wiring via layer 113c penetrating through the third insulating layer 111c and connecting the second and fourth wiring layers 112b and 112d, a first passivation layer 115a disposed on the upper surface of the third insulating layer 111c, and a second passivation layer 115b disposed on the lower surface of the second insulating layer 111b, and may have a cavity 110H penetrating through the first and third insulating layers 111a and 111c and the first passivation layer 115a. A metal layer M, which is a barrier layer, may be located on the same level as the first wiring layer 112a. Among the plurality of insulating layers 111a, 111b and 111c, an uppermost insulating layer may be the third insulating layer 111c, and a lowermost insulating layer may be the second insulating layer 111b. An uppermost wiring layer of the plurality of wiring layers 112a, 112b, 112c and 112d may be the fourth wiring layer 112d, and a lowermost wiring layer may be the third wiring layer 112c.

An insulating material may be used as a material for the plurality of insulating layers 111a, 111b and 111c, and as the insulating material, a thermosetting resin such as epoxy resin or a thermoplastic resin such as polyimide, and a material in which these resins are mixed with an inorganic filler such as silica and/or a reinforcing material such as glass fiber may be used. For example, as a material of the first insulating layer 111a, an insulating material of Copper Clad Laminate (CCL) may be used, and as a material of the second and third insulating layers 111b and 111c, PPG may be used, respectively. The plurality of insulating layers 111a, 111b and 111c may be laminated in a cored shape. For example, the thickness of the first insulating layer 111a may be greater than the thickness of each of the second and third insulating layers 111b and 111c, but is not limited thereto.

As the material of the plurality of wiring layers 112a, 112b, 112c and 112d, a metal material such as copper (Cu), aluminum (Al), silver (Ag), tin (Sn), gold (Au), nickel (Ni), lead (Pb), titanium (Ti) or alloys thereof, may be used. Each of the plurality of wiring layers 112a, 112b, 112c and 112d may perform various functions according to a design. For example, the plurality of wiring layers 112a, 112b, 112c and 112d may include a ground pattern, a power pattern, a signal pattern, and the like. In this case, the signal pattern includes various signals, such as data signals, excluding the ground pattern and the power pattern. Each of these patterns may have a line, plane, or pad shape. The plurality of wiring layers 112a, 112b, 112c and 112d may be formed by a plating process such as MSAP or TT, and as a result, each may include a seed layer, which is an electroless plating layer, and an electrolytic plating layer formed based on the seed layer. A specific layer may further include copper foil.

A metal material may be used as a material for the plurality of wiring via layers 113a, 113b and 113c, and as the metal material, copper (Cu), aluminum (Al), silver (Ag), tin (Sn), gold (Au), nickel (Ni), lead (Pb), titanium (Ti), or alloys thereof may be used. Each of the plurality of wiring via layers 113a, 113b and 113c may include a signal connection via, a ground connection via, a power connection via, and the like according to a design. Each of wiring vias of the plurality of wiring via layers 113a, 113b and 113c may be completely filled with a metal material, or may be formed as the metal material is formed along a wall surface of the via hole. The wiring vias of the first wiring via layer 113a may have an hourglass or cylindrical shape, and the wiring vias of the second and third wiring via layers 113b and 113c may have shapes tapered in opposite directions. The plurality of wiring via layers 113a, 113b and 113c may be formed by a plating process, for example, MSAP, TT, or the like, and as a result, may include a seed layer, which is an electroless plating layer, and an electrolytic plating layer formed based on the seed layer.

Other details are substantially the same as described above and may thus be omitted.

Figure 14:
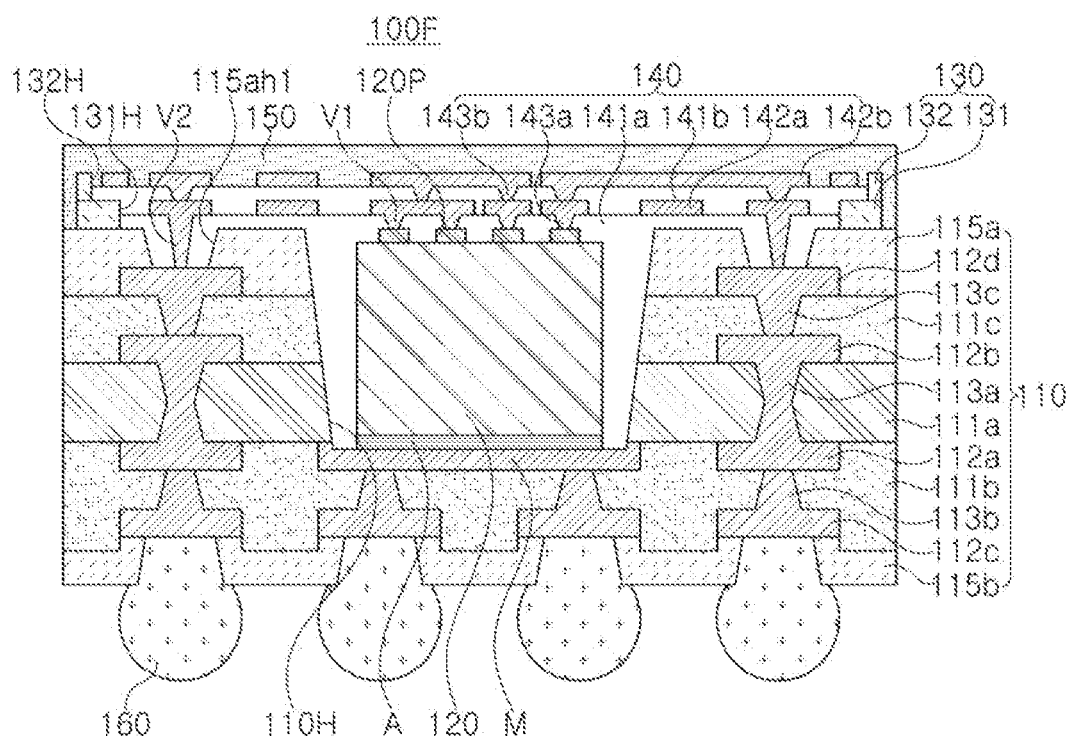
FIG. 14 is a schematic cross-sectional view of another example of an electronic component-embedded substrate.

FIG. 14 is a schematic cross-sectional view of another example of an electronic component-embedded substrate.

Referring to the drawings, in an electronic component-embedded substrate 100F according to another example, a dam structure 130 includes a plurality of dam portions 131 and 132 which have through-portions 131H and 132H, respectively, in the above-described electronic component-embedded substrate 100E. For example, the dam structure 130 may include a first dam portion 131 having a first through-portion 131H, and a second dam portion 132 disposed on the first dam portion 131 and having a second through-portion 132H connected to the first through-portion 131H. Inner walls of the first and second through-portions 131H and 132H may have a step difference, and in this case, the circuit structure 140 may be formed to have a relatively larger area. If necessary, the circuit structure 140 may be configured in further multiple layers accordingly.

Other details are substantially the same as described above and may thus be omitted.

Figure 15:
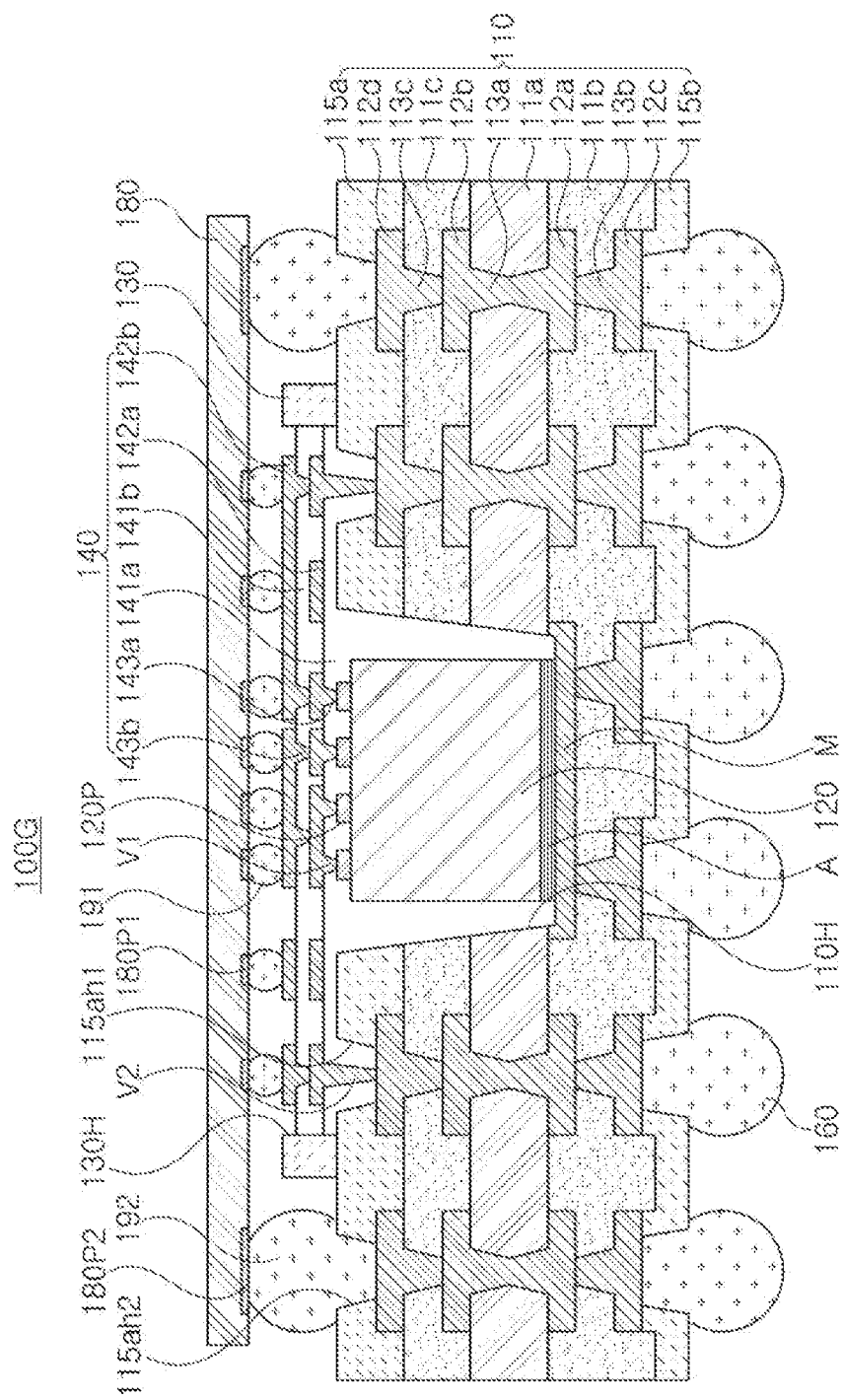
FIG. 15 is a schematic cross-sectional view illustrating another example of an electronic component-embedded substrate.

FIG. 15 is a schematic cross-sectional view illustrating another example of an electronic component-embedded substrate.

Figure 16:
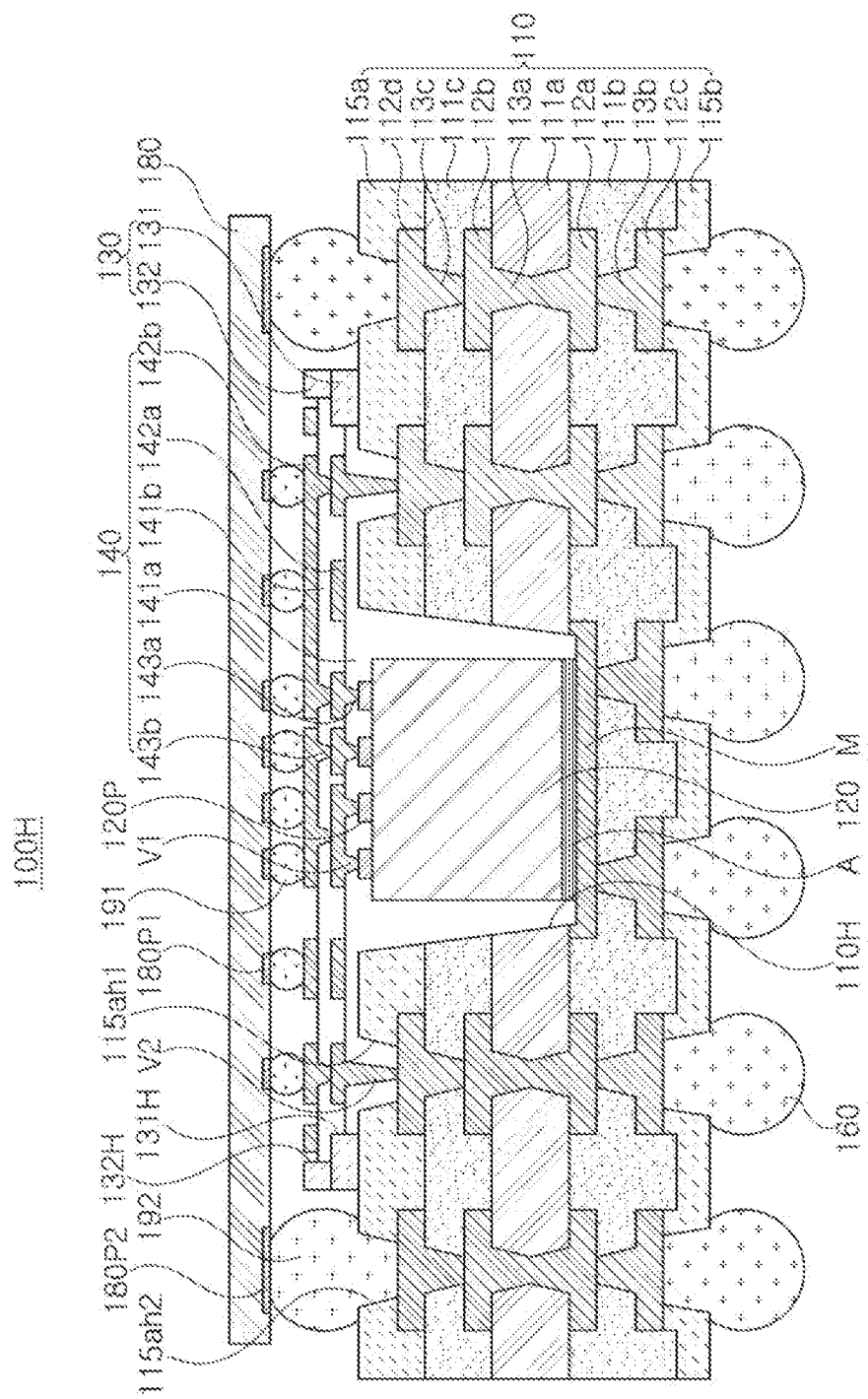
FIG. 16 is a schematic cross-sectional view of another example of an electronic component-embedded substrate.

FIG. 16 is a schematic cross-sectional view of another example of an electronic component-embedded substrate.

Referring to the drawings, electronic component-embedded substrates 100G and 100H according to other examples further include a second electronic component 180 disposed on the first passivation layer 115a and at least partially overlapping the first electronic component 120 on a plane in the above-described electronic component-embedded substrates 100E and 100F. In this case, the circuit structure 140 is disposed between the first and second electronic components 120 and 180 and may serve as an interconnection therebetween. For example, the second electronic component 180 may be disposed in a face-down shape such that the plurality of second connection pads 180lP1 and 180P2 face the circuit structure 140, and at least one 180P1 of the plurality of second connection pads 180P1 and 180P2 may be electrically connected to at least one of the plurality of first connection pads 120P of the first electronic component 120 through the first connection member 191 and the circuit structure 140. In addition, the first passivation layer 115a may include not only a first opening 115ah1 exposing at least a portion of an uppermost fourth wiring layer 112d of the wiring structure 140, but also a second opening 115ah2 that exposes another at least part. In this case, at least the other 180P2 of the plurality of second connection pads 180P1 and 180P2 of the second electronic component 180 may be electrically connected to another at least portion of the fourth wiring layer 112d exposed through the second opening 115ah2 of the first passivation layer 115a, through the second connection member 192. The second opening 115ah2 may be located outside of the through-portion 130H of the dam structure 130.

The second electronic component 180 may be an IC in which hundreds to millions of devices are integrated into one chip. For example, the second electronic component 180 may be a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, may be an AP, but is not limited thereto. In addition, the second electronic component 180 may be a memory such as other volatile memories (for example, a dynamic random access memory (DRAM)), a non-volatile memory (for example, a read only memory (ROM)), a flash memory, or the like; or logic such as an analog-to-digital (ADC) converter, an application-specific integrated circuit (ASIC), or the like. The second electronic component 180 may be a chip-shaped passive component, for example, a chip-shaped inductor or a chip-type capacitor. Alternatively, the second electronic component 180 may be a combination of an IC and a chip-shaped passive component.

The second electronic component 180 may be disposed in a face-down shape such that a surface on which the second connection pads 180P1 and 180P2 are disposed faces the circuit structure 140. The second electronic component 180 may be surface mounted on the wiring structure 110 and the circuit structure 140 through the first and second connection members 191 and 192. The second connection pads 180P1 and 180P2 may include a metal material such as copper (Cu) or aluminum (Al). The second connection pads 180P1 and 180P2 may be disposed to protrude from the insulating body of the second electronic component 180, or alternatively, may be disposed to be embedded in the insulating body of the second electronic component 180. The second connection pads 180P1 and 180P2 are provided with metal bumps such as copper bumps further disposed thereon, and may be connected to the first and second connection members 191 and 192, respectively. The first and second connection members 191 and 192 may be formed of tin (Sn) or an alloy containing tin (Sn), for example, solder, or the like, which is only an example, and the material thereof is not specifically limited thereto. Each of the first and second connection members 191 and 192 may be a ball or the like.

Other details are substantially the same as described above and may thus be omitted.

As set forth above, according to an embodiment, an electronic component-embedded substrate in which the substrate may be reduced in size and thickness and an electronic component may be embedded in a cavity in a face-up form, may be provided.

Furthermore, an electronic component-embedded substrate in which a microcircuit region may be locally applied onto the electronic component may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component-embedded substrate comprising:
   a wiring structure including a plurality of insulating layers and a plurality of wiring layers and having a cavity penetrating through at least one of the plurality of insulating layers;
   a first electronic component disposed in the cavity;
   a dam structure disposed on the wiring structure and having a through-portion;
   a first insulating material disposed in at least a portion of each of the cavity and the through-portion, and covering at least a portion of each of the wiring structure and the first electronic component; and
   a first circuit layer disposed on the first insulating material,
   wherein at least a portion of the first circuit layer is disposed in the through-portion.

2. The electronic component-embedded substrate of claim 1, wherein the dam structure surrounds the cavity on a plane, and
   the through-portion exposes the cavity.

3. The electronic component-embedded substrate of claim 2, wherein the dam structure includes a first dam portion having a first through-portion, and a second dam portion disposed on the first dam portion and having a second through-portion connected to the first through-portion,
   wherein inner walls of the first and second through-portions have a step difference.

4. The electronic component-embedded substrate of claim 1, further comprising:
   a second insulating material disposed on the first insulating material within the through-portion and covering at least a portion of the first circuit layer; and
   a second circuit layer disposed on the second insulating material.

5. The electronic component-embedded substrate of claim 1, wherein the dam structure comprises solder resist.

6. The electronic component-embedded substrate of claim 1, wherein the first insulating material comprises a photo-imageable dielectric material.

7. The electronic component-embedded substrate of claim 1, wherein the first insulating material includes an insulating resin and an inorganic filler without glass fiber.

8. The electronic component-embedded substrate of claim 1, wherein the first circuit layer has a thickness less than a thickness of at least one of the plurality of wiring layers, and the first circuit layer has a pitch between patterns of the first circuit layer finer than a pitch between patterns of the at least one of the plurality of wiring layers.

9. The electronic component-embedded substrate of claim 1, wherein the cavity is provided with a stopper layer disposed on a bottom surface of the cavity, and
   the first electronic component is attached to the stopper layer through an adhesive member.

10. The electronic component-embedded substrate of claim 9, wherein the first electronic component is provided with a plurality of first connection pads disposed on an upper surface of the first electronic component, and
    at least a portion of the first circuit layer is connected to at least one of the plurality of first connection pads through a first connection via penetrating through at least a portion of the first insulating material.

11. The electronic component-embedded substrate of claim 1, wherein the wiring structure further includes a first passivation layer disposed on an uppermost insulating layer among the plurality of insulating layers, and a second passivation layer disposed on a lowermost insulating layer among the plurality of insulating layers.

12. The electronic component-embedded substrate of claim 11, wherein the first passivation layer has a first opening exposing at least a portion of an uppermost wiring layer among the plurality of wiring layers,
    wherein the first opening is located in the through-portion, on a plane,
    the first insulating material is disposed in at least a portion of the first opening, and
    at least a portion of the first circuit layer is connected to at least a portion of the uppermost wiring layer through a second connection via penetrating through the first insulating material in the first opening.

13. The electronic component-embedded substrate of claim 11, further comprising a second electronic component disposed on the first passivation layer and disposed to at least partially overlap the first electronic component on a plane,
    wherein the first circuit layer is disposed between the first and second electronic components.

14. The electronic component-embedded substrate of claim 13, wherein an upper surface of the first electronic component is provided with a plurality of first connection pads,
    a lower surface of the second electronic component is provided with a plurality of second connection pads,
    the first passivation layer has a second opening exposing another at least part of an uppermost wiring layer among the plurality of wiring layers,
    the second opening is located outside of the through-portion, on a plane,
    at least one of the plurality of second connection pads is connected to at least one of the plurality of first connection pads through a first connection member and the first circuit layer,
    the other at least one of the plurality of second connection pads is connected to another at least part of the uppermost wiring layer exposed through the second opening, through a second connection member.

15. An electronic component-embedded substrate comprising:
    a wiring structure including an insulating layer and a wiring layer disposed on the insulating layer and having a cavity having a bottom surface;
    an electronic component having one surface on which a connection pad is disposed and the other surface opposite to the one surface, and disposed in such a manner that the other surface faces the bottom surface of the cavity;
    a dam structure disposed on the wiring structure and having a through-portion having an area larger than an area of the cavity on a plane; and
    a circuit structure disposed in the through-portion and including an insulating material in which the electronic component is embedded and a circuit layer disposed on the insulating material, wherein at least portions of the wiring layer and the connection pad are connected to each other through at least a portion of the circuit layer, and wherein at least a portion of the circuit layer is disposed in the through-portion.

16. The electronic component-embedded substrate of claim 15, wherein the at least portions of the wiring layer and the connection pad are connected to the at least portions of the circuit layer, respectively, through a connection via penetrating through at least a portion of the insulating material.

17. The electronic component-embedded substrate of claim 15, wherein the circuit structure is also disposed on the cavity.

18. An electronic component-embedded substrate comprising:
　a wiring structure including a plurality of insulating layers and a plurality of wiring layers;
　a first electronic component attached to the wiring structure;
　a dam structure disposed on the wiring structure and having a through-portion;
　an insulating material disposed in the through-portion, and covering at least a portion of each of the wiring structure and the first electronic component; and
　a circuit layer disposed on the insulating material, wherein at least a portion of the circuit layer is disposed in the through-portion.

19. The electronic component-embedded substrate of claim 18, wherein the dam structure protrudes from the wiring structure, and
　among an inner space enclosed by the dam structure and an outer space outside the dam structure, the insulating material is disposed only in the inner space.

20. The electronic component-embedded substrate of claim 18, wherein the dam structure protrudes from the wiring structure, and
　among an inner space enclosed by the dam structure and an outer space outside the dam structure, the circuit layer is disposed only in the inner space.

21. The electronic component-embedded substrate of claim 18, wherein the dam structure includes a first dam portion having a first through-portion, and a second dam portion disposed on the first dam portion and having a second through-portion connected to the first through-portion.

22. The electronic component-embedded substrate of claim 18, wherein the circuit layer has a thickness less than a thickness of at least one of the plurality of wiring layers, and the circuit layer has a pitch between patterns of the circuit layer finer than a pitch between patterns of the at least one of the plurality of wiring layers.

23. The electronic component-embedded substrate of claim 18, wherein the first electronic component is provided with a plurality of first connection pads disposed on an upper surface of the first electronic component,
　a portion of the circuit layer is connected to at least one of the plurality of first connection pads through a first connection via penetrating through at least a portion of the insulating material, and
　another portion of the circuit layer is connected to at least a portion of an uppermost wiring layer of the plurality of wiring layers through a second connection via penetrating through the first insulating material.

24. The electronic component-embedded substrate of claim 18, further comprising a second electronic component disposed on the circuit layer,
　wherein an upper surface of the first electronic component is provided with a plurality of first connection pads,
　a lower surface of the second electronic component is provided with a plurality of second connection pads, and
　at least one of the plurality of first connection pads is connected to at least one of the plurality of second connection pads through at least the circuit layer disposed between the first electronic component and the second electronic component.

* * * * *